United States Patent [19]

Heidemann

[11] Patent Number: 5,363,385
[45] Date of Patent: Nov. 8, 1994

[54] FIBER-OPTIC AMPLIFIER WITH CONTROL OF THE PUMP LIGHT WAVELENGTH

[75] Inventor: Rolf Heidemann, Tamm, Germany

[73] Assignee: Alcatel N.V., Amsterdam, Netherlands

[21] Appl. No.: 20,083

[22] Filed: Feb. 19, 1993

[30] Foreign Application Priority Data

Mar. 19, 1992 [DE] Germany .................. 4208858

[51] Int. Cl.⁵ .................. H01S 3/30; H01S 3/091
[52] U.S. Cl. .................. 372/6; 372/69; 372/70; 385/27; 385/42; 385/31; 385/38; 359/333; 359/341; 359/345
[58] Field of Search .................. 385/27, 42, 45, 31, 385/38, 39; 372/6, 70, 71, 75, 69; 359/333, 339, 341, 342, 343, 345

[56] References Cited

U.S. PATENT DOCUMENTS

| 4,307,469 | 12/1981 | Casper et al. | 359/333 X |
|---|---|---|---|
| 5,101,461 | 3/1992 | Nakajima | 372/6 X |
| 5,119,230 | 6/1992 | Pfeiffer | 359/341 |
| 5,138,621 | 8/1992 | Goto et al. | 372/6 |
| 5,163,058 | 11/1992 | Farries et al. | 372/6 |
| 5,216,728 | 6/1993 | Charlton et al. | 385/27 |
| 5,222,089 | 6/1993 | Huber | 372/6 X |
| 5,239,607 | 8/1993 | da Silva et al. | 372/6 X |
| 5,245,690 | 9/1993 | Aida et al. | 372/6 X |
| 5,257,273 | 10/1993 | Farries et al. | 372/6 |
| 5,268,910 | 12/1993 | Huber | 372/6 |
| 5,297,154 | 3/1994 | Heidemann et al. | 372/6 |
| 5,311,525 | 5/1994 | Pantell et al. | 372/6 |

FOREIGN PATENT DOCUMENTS

| 0390525 | 10/1990 | European Pat. Off. . | |
|---|---|---|---|
| 3214614 | 11/1982 | Germany | 372/70 X |
| 1246884 | 2/1989 | Japan . | |
| 4003028 | 1/1992 | Japan . | |

OTHER PUBLICATIONS

Wedding et al., "5 Gbit/s Transmission over 146 Km Using Erbium-Doped Fibre Amplifier," Proceedings, vol. 1 15th European Conference on Optical Communication, Sep. 10–14, 1989, ECOC '89, pp. 86–89.

Chen et al., "Structural and Compositional Control of the Output Wavelength of Very High Power 0.98 μm GaInAs Lasers for Pumping Fiber Amplifiers", IEEE Photonics Tech. Ltrs., vol. 3, No. 8, Aug. 1991, pp. 694–696.

*Primary Examiner*—Brian Healy
*Attorney, Agent, or Firm*—Spencer, Frank & Schneider

[57] ABSTRACT

A fiber-optic amplifier for use with optical communications systems includes a light waveguide piece for amplifying an optical input signal. A pump light source is coupled to the amplifying light waveguide piece and includes a semiconductor laser for generating pump light for the amplifying light waveguide piece. A control device regulates the wavelength of the pump light generated by the semiconductor laser to be within a desired wavelength range so that the pump light is maximally absorbed in the amplifying light waveguide piece.

12 Claims, 1 Drawing Sheet

FIBER-OPTIC AMPLIFIER WITH CONTROL OF THE PUMP LIGHT WAVELENGTH

CROSS REFERENCE TO RELATED APPLICATION

This application claims the priority of Application Ser. No. P 42 08 858.5, filed Mar. 19th, 1992, in the Federal Republic of Germany, the subject matter of which is incorporated herein by reference.

BACKGROUND OF THE INVENTION

1. Field of the Invention

The present invention relates to a fiber-optic amplifier including a light waveguide piece and a pump light source.

2. Background Information Such a fiber-optic amplifier is known from many sources, for example, from: "ECOC '89", 15th European Conference on Optical Communication, Sep., 10–14, 1989, Gothenburg, Sweden, Proceedings, Vol. 1, Regular Papers TUA 5–7, pages 86–89. The amplifying piece of light waveguide there is an $Er^{3+}$ doped light waveguide piece and the light of the pump light source is coupled into the amplifying light waveguide piece by way of a coupler. Two different variations are described there. In the first configuration (co-propagating configuration), the pump light coupler is arranged upstream of the amplifying fiber piece with respect to the transmission direction up to the amplification of the optical signal. In the second configuration (counter-propagating configuration), the coupler for coupling the pump light into the amplifying light waveguide piece is disposed downstream of the light waveguide piece with respect to the transmission direction of the optical signal to be amplified. For the present invention, the difference between the two configurations is of no significance.

The aspect of the fiber-optic amplifier of interest here is its pump light source, more precisely, the wavelength of the pump light generated by the source. T. R. Chen discloses in "Structural and Compositional Control of the Output Wavelength of Very High Power 0.98 μm GaInAs Lasers for Pumping Fiber Amplifiers", in IEEE Photonics Technology Letters, Vol. 3, No. 8, August, 1991, pages 694–696, that the performance of fiber-optic amplifiers equipped with $Er^{3+}$ doped amplifying light waveguide pieces is substantially dependent on the wavelength of the pump light generated by the pump light source. Consequently, the wavelength of the light generated by the pump light source should lie at 980 nm with a tolerance of 2 nm. Various measures are described for taking care that during the manufacture of a certain semiconductor laser its wavelength lies in that range.

Even if it is accomplished, during the manufacture of the semiconductor laser, that its emission wavelength lies precisely at or near the wavelength that is suitable as pump light for the fiber-optic amplifier, difficulties may nevertheless arise if the semiconductor laser is employed, for example, in a fiber-optic amplifier because the emission wavelength may change due to aging of the semiconductor laser or as a function of the ambient temperature. The cited publication does not discuss these difficulties but concerns itself only with how the desired wavelength can be realized as accurately as possible during manufacture.

SUMMARY OF THE INVENTION

It is an object of the invention to provide a fiber-optic amplifier that is improved with respect to the wavelength of its pump light source.

This is accomplished in a fiber-optic amplifier for optical communications systems, with the fiber-optic amplifier including a light waveguide piece which amplifies its optical input signal, a pump light source including a semiconductor laser for generating pump light for the amplifying light waveguide piece and means for coupling the generated pump light into the amplifying light waveguide piece, in that it includes a control device which regulates the wavelength of the pump light generated by the semiconductor laser within a desired wavelength range in such a manner that the pump light is maximally absorbed in the amplifying light waveguide piece.

BRIEF DESCRIPTION OF THE DRAWINGS

The invention will now be described in greater detail in connection with the drawings which depict embodiments thereof and in which.

DETAILED DESCRIPTION OF THE PREFERRED EMBODIMENTS

Figure 1:
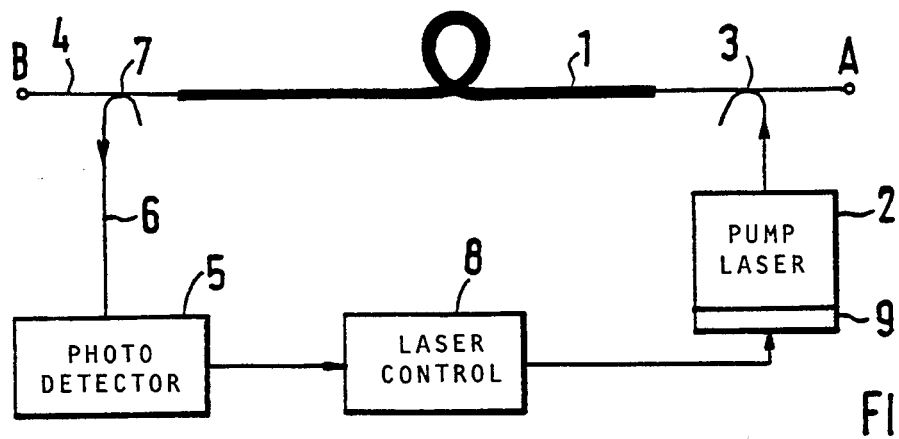
FIG. 1 depicts a first embodiment of a fiber-optic amplifier according to the invention in which the absorption of the pump light in the amplifying light waveguide piece is employed as a criterion for regulating the pump laser wavelength.

The fiber-optic amplifier according to FIG. 1 is essentially composed, like prior art fiber-optic amplifiers, of a light waveguide piece 1 which is suitable as an amplifying light waveguide piece in a fiber-optic amplifier, for example a piece of an $E^{3+}$ doped light waveguide, a semiconductor laser 2 which generates the pump light for the fiber-optic amplifier, and a pump light coupler 3 which is connected with one end of light waveguide piece 1 and serves to couple the pump light generated by semiconductor laser 2 into light waveguide piece 1. Semiconductor laser 2 will hereinafter sometimes be called the pump laser. Together with non-illustrated current supply devices, the laser constitutes the pump light source of the fiber-optic amplifier. A terminal A of fiber-optic coupler 3 constitutes the input or output of the fiber-optic amplifier.

On the other side of light waveguide piece 1, a light waveguide piece 4 leads to a terminal B of the fiber-optic amplifier. The fiber-optic amplifier may either be operated in such a way that its signal light input is terminal A and its signal light output is terminal B or vice versa. The fiber-optic amplifier described so far is known.

According to the invention, the fiber-optic amplifier additionally includes a photodetector 5 whose optical input is connected by way of a light waveguide piece 6 and a fiber-optic coupler 7 with the end of light waveguide piece 1 which is connected with terminal B by way of light waveguide piece 4. Light waveguide piece 4 may be part of fiber-optic coupler 7. Photodetector 5 receives part of the pump light that is not absorbed in light waveguide piece 1 and converts it to an electrical signal that corresponds to its intensity. Its electrical output signal reaches a laser control circuit 8 which regulates pump laser 2 in a desired wavelength range in such a way that the pump light generated by it is maximally absorbed in light waveguide piece 1, that is, the intensity of the pump light leaving light waveguide piece 1 becomes minimal. Fiber-optic coupler 7 is wavelength selective in such a way that it couples only pump light and no signal light to the optical input of photodetector 5.

In FIG. 1 as well as in FIG. 2, which will be described below, the amplifying light waveguide piece is shown as a thicker line than the normal light waveguide pieces that are employed as components of couplers and as other connecting pieces, so as to distinguish the amplifying light waveguide piece from them. In reality, of course, it is no thicker, it is merely doped differently in its core.

For the sake of simplification, the term light will hereinafter be employed for any optical radiation, that is, also for wavelengths outside of the visible range. Preferably, the pump light has a wavelength in a range of 980 nm and the signal light has a wavelength in a range of 1550 nm.

In controlling the wavelength of the pump light generated by pump laser 2, advantage is taken of the fact that the wavelength is a function of the temperature of the semiconductor laser. The temperature in turn is thermoelectrically controllable, as is customary for semiconductor lasers, in that a thermoelectric cooling device 9, a so-called Peltier cooler, is provided in the laser. An electrical cooler current here determines the present temperature of pump laser 2. This cooler current is now controlled according to the invention by laser control circuit 8 in such a way that the wavelength of the pump light is regulated in the described manner to the desired wavelength.

Controllable thermoelectric coolers for semiconductor lasers or semiconductor components are known per se, for example, from U.S. Pat. No. 4,307,469 or from DE-C 3,214,614, and therefore do not require discussion in greater detail.

Instead of by way of the cooler current of laser cooler 9, the pump light wavelength of laser 2 can also be regulated by controlling the mean operating current of the laser. A combination of a regulation by way of the temperature and a regulation by way of the mean operating current is also possible. How the laser control operates will be described later.

First, a second embodiment of the fiber-optic amplifier according to the invention will be described with reference to FIG. 2. As in FIG. 1, the fiber-optic amplifier here is again supplemented, according to the invention, by a photodetector 5 and a laser control circuit 8 which, on the basis of the electrical output signal of photodetector 5, regulates the pump light wavelength of pump laser 2, preferably by way of the cooler current of the thermoelectric cooler 9 of pump laser 2. In contrast to the embodiment according to FIG. 1, photodetector 5 here does not receive the pump light exiting from the amplifying light waveguide piece 1 but pump light that exits from a reference light waveguide piece 10 into whose other end is coupled the pump light generated by pump laser 2. Part of the pump light generated by pump laser 2 is coupled into one end of reference light waveguide piece 10 and the light not absorbed there travels from the other end of reference light waveguide piece 10 to the optical input of the photodetector, either by way of a light waveguide piece 11 or in that the reference light waveguide piece is brought to the optical input of photodetector 5.

Figure 2:
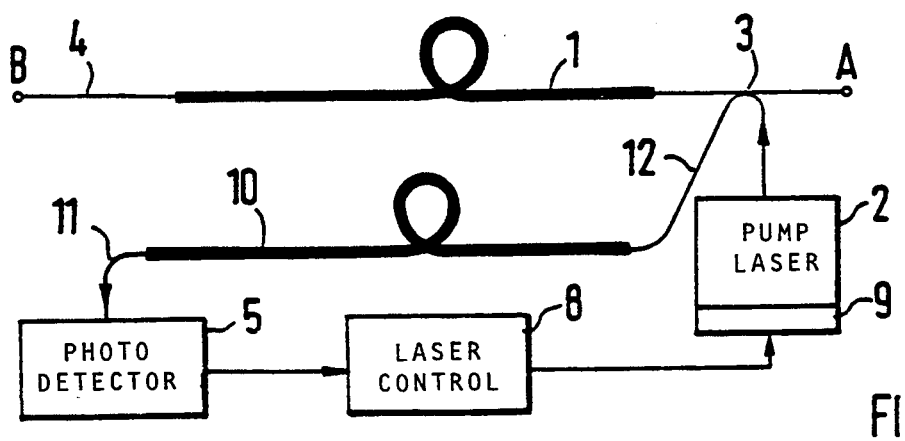
FIG. 2 depicts a second embodiment of the fiber-optic amplifier according to the invention in which the absorption in a reference light waveguide piece is employed as the criterion for regulating the pump laser wavelength.

The means for coupling in part of the pump light generated by pump laser 2 into one end of the reference light waveguide piece is preferably, as shown in FIG. 2, the fiber-optic coupler 3 that is provided in any case, in that its free coupler output is connected by way of a light waveguide connector 12 with the mentioned end of reference light waveguide piece 10. The fiber-optic coupler 3 is a wavelength selective coupler which at its free coupler output puts out only pump light and no signal light. Light waveguide connector 12 may also be omitted if reference light waveguide piece 10 is brought directly to the free terminal of fiber-optic coupler 3.

The significant characteristic of reference light waveguide piece 10 is that its light absorption maximum in the wavelength range of the pump light lies at the same wavelength as that of amplifying light waveguide piece 1. Of course this is the case if the light waveguide piece is of the same type as the amplifying light waveguide piece 1. However, it is known that this may also be the case if reference light waveguide piece 10 differs from the amplifying light waveguide piece 1 by different doping of its core, aside from the $E^{3+}$ dopant. For example, it is possible to employ an amplifying light waveguide piece 1 whose core is not only doped with germanium but also with aluminum, if such a composition is of advantage for use as an amplifying light waveguide piece in a fiber-optic amplifier. Nevertheless it will then be favorable to employ a reference light waveguide piece 10 whose core is not doped with aluminum. Such a light waveguide piece also has its absorption maximum at the same wavelength (980 nm) but it is much more distinct so that it is more suitable as a reference light waveguide piece for tuning the pump light wavelength of pump laser 2 on the maximum absorption wavelength of the pump light in light waveguide piece 1. Thus the only thing important for the selection of reference light waveguide piece 10 is that, on the basis of its wavelength dependent absorption, is suitable as a good reference light waveguide in relation to the amplifying light waveguide 1. In the drawing, it as well as the amplifying light waveguide piece 1 are shown thicker than the normal light waveguide pieces.

In the embodiment according to FIG. 2, the criterion for regulating the wavelength of the pump laser is the pump light that is not absorbed in a reference light waveguide piece, while in the embodiment according to FIG. 1 the criterion for the laser regulation is the pump light that is not absorbed in the amplifying light waveguide piece. The advantage of the solution according to FIG. 2 compared to that of FIG. 1 is that the fiber-optic coupler required in FIG. 1 for coupling out the nonabsorbed pump light in the direction toward photodetector 5 is not required and that the regulation can be effected more accurately if a light waveguide piece is employed that is especially selected as reference light waveguide piece for the purpose of regulating the pump light wavelength.

Instead of, as shown, employing the free terminal of the fiber-optic coupler 3 that is required in any case, any other means can be employed that is suitable to couple part of the light generated by pump laser 2 into reference light waveguide piece 10. For example, the light exiting at the rear end of pump laser 2 may also be coupled into reference light waveguide piece 10, either directly or by way of a light waveguide connector.

Figure 3:
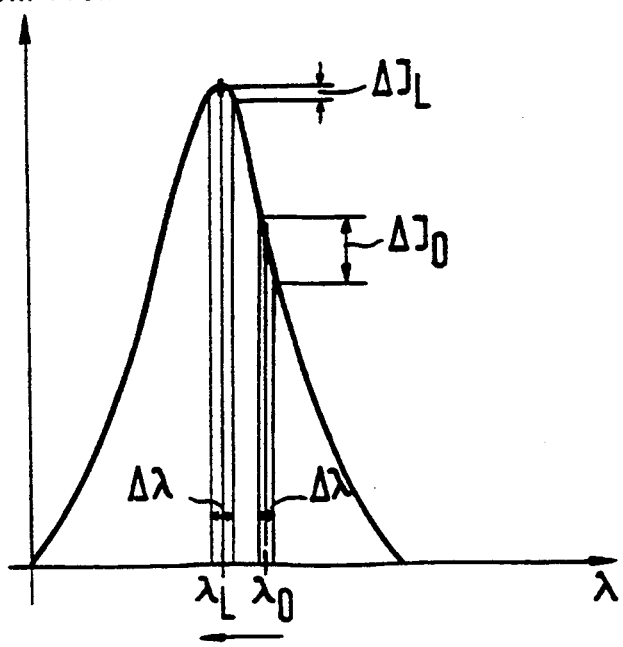
FIG. 3 is a schematic representation of the wavelength dependent curve of the absorption of light in a range of 980 nm in an $Er^{3+}$ doped light waveguide piece to explain the regulation of the wavelength to the absorption maximum.

It will now be described with reference to FIG. 3 how the laser control circuit 8 preferably operates. The drawing figure is a schematic representation of the strong wavelength dependence of the absorption as it is typical for an $Er^{3+}$ doped light waveguide piece in a wavelength range of 980 nm. For the reasons discussed above, the pump light wavelength should ideally lie at the point where the absorption curve has its maximum, that is at $\lambda_L$. FIG. 3 considers the case that the emission wavelength differs and lies at $\lambda_O$, where the absorption is very far removed from its maximum so that there is a need for regulation. The regulation refers only to a desired wavelength range, for example the range around 980 nm, and the absorption maximum at that location. The term "maximum" thus means a local maximum and not the absolutely possible maximum from several local maxima.

Laser control circuit 8 includes a modulator which, by means of its output control signal that controls the wavelength of laser 2 by way of its temperature, very slowly modulates the wavelength of the pump light with a fluctuation of $\Delta\lambda$, for example at a modulation frequency of only 1 Hz. Such a modulation of the wavelength around $\lambda_O$ causes the electrical output signal of the photodetector to include a signal component at this modulation frequency. Its magnitude corresponds to the fluctuation $\Delta I_O$ in the intensity of the light received in photodetector 5 as a result of the modulation of the wavelength with the fluctuation $\Delta\lambda$. Thus, the magnitude is greater the more the present wavelength $\lambda_O$ around which the modulation takes place lies in a region where the absorption curve is very steep. Thus it is possible to derive from the mentioned signal component a control signal for shifting $\lambda_O$. This is done by phase-sensitive rectification of the signal component with respect to the phase of the modulation. This also determines which sign the control signal to be put out by laser control circuit 8 must have, that is, in which direction $\lambda_O$ must be displaced.

If the present wavelength $\lambda_O$ lies in a region as shown in the example of FIG. 3, the absorption decreases, that is, the intensity of the received light increases if the wavelength is just being raised during the modulation. If, thus, this phase relationship is detected, $\lambda_O$ must be reduced so that it approaches the optimum wavelength $\lambda_L$. If $\lambda_O$ were to lie below $\lambda_L$, these phase relationships would be reversed so that then $\lambda_O$ would have to be increased.

Such a regulation of $\lambda_O$ in the direction toward $\lambda_L$ on the basis of the component at the modulation frequency in the output signal of the photodetector is performed until this component has disappeared. That is the case when $\lambda_O$ lies so close to $\lambda_L$ that the emission wavelength as a result of the modulation goes above and below the optimum wavelength $\lambda_O$. Instead of the signal component at the modulation frequency, a signal component at twice the modulation frequency then appears in the output signal of the photodetector because then the absorption passes through its maximum twice within one modulation period of the wavelength. As shown in the example of FIG. 3, the fluctuation $\Delta I_L$ is then reduced to a minimum.

In the discussion above, preferred embodiments of the light waveguide pieces were those which are doped with $E^{3+}$ as the laser-active substance. Instead, light waveguide pieces may also be employed which are doped with another laser-active substance, for example, Nd or Yb.

It will be understood that the above description of the present invention is susceptible to various modifications, changes and adaptations, and the same are intended to be comprehended within the meaning and range of equivalents of the appended claims.

What is claimed is:

1. A fiber-optic amplifier for use with optical communications systems, the fiber-optic amplifier comprising:
   a light waveguide piece for amplifying an optical input signal,
   a pump light source including a semiconductor laser, for generating pump light for the amplifying light waveguide piece,
   coupling means for coupling generated pump light into the amplifying light waveguide piece, and
   control means for regulating the pump light generated by the semiconductor laser to be within a desired wavelength range wherein the pump light is maximally absorbed in the amplifying light waveguide piece.

2. A fiber-optic amplifier according to claim 1,
   wherein said control means includes a reference light waveguide piece;
   wherein said coupling means couples a portion of the pump light into the reference light waveguide piece; and
   wherein said control means regulates the pump light wavelength as a function of absorption of the portion of pump light coupled into the reference light waveguide piece.

3. A fiber-optic amplifier according to claim 1,
   wherein said control means employs a reference light waveguide piece, said control means regulating the pump light wavelength as a function of absorption of the pump light coupled into the reference light waveguide piece; and
   wherein said reference light waveguide piece is said amplifying light waveguide piece.

4. A fiber-optic amplifier according to claim 2, wherein said reference light waveguide piece comprises a light waveguide piece having an absorption maximum at the same wavelength as the amplifying light waveguide piece.

5. A fiber-optic amplifier according to claim 3,
   wherein said control means includes a photodetector which converts a light signal exiting the reference light waveguide piece into an electrical signal corresponding to the exiting light signal intensity; and
   wherein said control means includes a control circuit which regulates the wavelength of the pump light generated by the semiconductor laser based on the electrical signal so that light coupled into the reference light waveguide piece is maximally absorbed therein.

6. A fiber-optic amplifier according to claim 5, wherein said control means includes means for controlling the temperature of the semiconductor laser, the control means thereby regulating the wavelength of the pump light generated by the semiconductor laser by controlling the temperature of the semiconductor laser.

7. A fiber-optic amplifier according to claim 5, wherein the control means regulates the wavelength of the pump light generated by the semiconductor laser by controlling a mean operating current of the semiconductor laser.

8. A fiber-optic amplifier according to claim 5, wherein said control means includes:

means for modulating the wavelength of the pump light generated by said semiconductor laser with a very low frequency, and means for deriving from a variation of the output signal of said photodetector occurring at the very low frequency, a control signal for shifting the wavelength of the pump light generated by said semiconductor laser whereby the absorption of the pump light in said reference light waveguide piece becomes maximum.

9. A fiber-optic amplifier according to claim 3, further comprising a second coupling means for coupling a portion of light exiting from said amplifying light waveguide piece to said control means.

10. A fiber-optic amplifier according to claim 2, wherein said coupling means comprises a wavelength selective fiber-optic coupler which outputs only light having the wavelength of the pump light.

11. A fiber-optic amplifier according to claim 2, wherein said amplifying light waveguide piece comprises a waveguide piece having a core doped with germanium and aluminum, wherein said reference light waveguide piece comprises a waveguide piece having a core doped with germanium but not doped with aluminum, and wherein said waveguide pieces have absorption maximums at the same wavelength but said reference waveguide piece has a more distinct absorption maximum than said amplifying waveguide piece.

12. A fiber-optic amplifier comprising:

an amplifying light waveguide piece for amplifying an input light signal;

a pump source for producing pump light;

first coupling means for coupling the pump light into said amplifying light waveguide piece at a first end thereof;

control means for controlling said pump source; and second coupling means for coupling to said control means a portion of an amplified light signal produced by said amplifying light waveguide piece from a second end thereof;

wherein said control means controls the pump source to produce pump light within a wavelength range where the pump light is maximally absorbed in the amplifying light waveguide piece based on the intensity of the portion of the amplified light signal coupled to the control means.

* * * * *